(12) United States Patent
Yen et al.

(10) Patent No.: US 10,593,464 B2
(45) Date of Patent: Mar. 17, 2020

(54) SEMICONDUCTOR ELEMENT

(71) Applicant: REALTEK SEMICONDUCTOR CORPORATION, Hsinchu (TW)

(72) Inventors: Hsiao-Tsung Yen, Hsinchu (TW); Cheng-Wei Luo, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/649,465

(22) Filed: Jul. 13, 2017

(65) Prior Publication Data

US 2018/0040412 A1   Feb. 8, 2018

(30) Foreign Application Priority Data

Aug. 5, 2016  (TW) .............................. 105124973 A

(51) Int. Cl.
*H01F 27/28*   (2006.01)
*H01L 23/522*   (2006.01)
(Continued)

(52) U.S. Cl.
CPC ......... *H01F 27/2804* (2013.01); *H01F 27/29* (2013.01); *H01L 23/5227* (2013.01); *H01L 28/10* (2013.01); *H01F 2027/2809* (2013.01)

(58) Field of Classification Search
USPC ................ 336/184, 200, 223, 232, 182, 180
See application file for complete search history.

(56) References Cited

U.S. PATENT DOCUMENTS 6,577,219 B2 *  6/2003  Visser ................. H01F 17/0006
                                                   336/180
7,151,430 B2    12/2006  Mattsson
(Continued)

FOREIGN PATENT DOCUMENTS

CN        1522450 A      8/2004
CN       15522450 A      8/2004
(Continued)

OTHER PUBLICATIONS

OA letter of an US application (U.S. Appl. No. 15/649,347) dated Sep. 21, 2018 and an OA letter of the counterpart CN application (appl. No. 201610665333.5) of that US application (U.S. Appl. No. 15/649,347) dated Oct. 22, 2018. (1) OA letter of counterpart CN application of application No. 201610665333.5 dated Oct. 22, 2018. (2) Summary of the OA letter of item 1: (1)Claims 1, 6, and 10 are anticipated by reference 1(CN101673865B).
(Continued)

*Primary Examiner* — Elvin G Enad
*Assistant Examiner* — Kazi S Hossain
(74) *Attorney, Agent, or Firm* — WPAT, PC

(57) ABSTRACT

A semiconductor element includes a first coil substantially located at a first plane; a second coil substantially located at the first plane; a connecting section that connects the first coil and the second coil; a third coil substantially located at a second plane different from the first plane; and a fourth coil substantially located at the second plane. The third coil and the first coil are connected through a through structure, and the fourth coil and the second coil are connected through a through structure. The third coil and the fourth are not directly connected.

9 Claims, 10 Drawing Sheets

⊠ through position

(51) Int. Cl.
*H01L 49/02* (2006.01)
*H01F 27/29* (2006.01)

(56) References Cited

U.S. PATENT DOCUMENTS

| | | | |
|---|---|---|---|
| 7,642,891 B2 | 1/2010 | Einzinger et al. | |
| 8,008,978 B2 | 8/2011 | Deguchi | |
| 8,183,971 B2 | 5/2012 | Le Guillou et al. | |
| 8,305,182 B1 | 11/2012 | Tsai et al. | |
| 8,543,190 B2 | 9/2013 | Wasson et al. | |
| 9,299,764 B2 | 3/2016 | Mattsson et al. | |
| 2002/0109573 A1 | 8/2002 | Iwanami | |
| 2003/0001709 A1 | 1/2003 | Visser | |
| 2007/0158782 A1* | 7/2007 | Heikkinen | H01F 17/0006 257/531 |
| 2009/0045903 A1 | 2/2009 | Lin et al. | |
| 2010/0164667 A1 | 7/2010 | Ho-Hsiang | |
| 2011/0043316 A1* | 2/2011 | Yang | H01F 19/04 336/192 |
| 2012/0044034 A1 | 2/2012 | Nazarian et al. | |
| 2015/0206634 A1 | 7/2015 | Yan et al. | |
| 2016/0118180 A1* | 4/2016 | Chen | H01F 21/12 336/170 |
| 2017/0012601 A1 | 1/2017 | Yen | |
| 2017/0098500 A1 | 4/2017 | Yen et al. | |
| 2017/0200547 A1 | 7/2017 | Yen et al. | |

FOREIGN PATENT DOCUMENTS

| | | |
|---|---|---|
| CN | 101253586 A | 8/2008 |
| CN | 101673865 B | 2/2014 |
| CN | 104584152 A | 4/2015 |
| JP | 2005327931 A | 11/2005 |
| TW | 201248658 | 12/2012 |

OTHER PUBLICATIONS

USPTO, "OA letter of application No. 15649347 dated Sep. 21, 2018", USA.
Taiwan Intellectual Property Office, "Office Action", dated Feb. 2, 2018. Summary: The OA letter recites that TW201248658 and JP2005327931A render claims 1-3 obvious.
OA letter of the CN application (appl. No. 201610663400.X) dated Mar. 4, 2019. Summary of the CN OA letter(appl. No. 201610663400.X): Claims 1-10 are rendered obvious by references 1 (CN101253586A) and 2(CN104584152A).
OA letter of the CN application (appl. No. 201610665108.1) dated Mar. 4, 2019. Summary of the CN OA letter (appl. No. 201610665108.1): Claims 1-8 are rendered obvious by references 1 (CN104584152A) and 2(CN101253586A).
U.S. Office Action in U.S. Appl. No. 15/649,503, dated Nov. 29, 2018.
Office Action letter of a US application (U.S. Appl. No. 15/649,503), dated Aug. 1, 2019.
OA letter of the CN application (appl. No. 201610665333.5) dated Apr. 22, 2019 Summary of the OA letter(Apr. 22, 2019): References 1(CN101673865) and 4(US2002109573A1) render claims 1, 3-9 obvious.
OA letter of the CN application (appl. No. 201610665333.5) dated Jan. 7, 2020 Summary of the OA letter(Jan. 7, 2020): References 1(CN101673865) and 4(US2002109573A1) render claims 1, 3-9 obvious.

* cited by examiner

SEMICONDUCTOR ELEMENT

BACKGROUND OF THE INVENTION

1. Field of the Invention

The present invention relates to a semiconductor element, especially to a semiconductor element that can be used as an integrated inductor or an integrated transformer.

2. Description of Related Art

Inductors and transformers are important elements in radio frequency integrated circuits to implement single-ended to differential signal conversion, signal coupling and impedance matching. As System-on-chips (SoC) become the mainstream of integrated circuits, integrated inductors and integrated transformers are gradually substituted for conventional discrete elements and are commonly applied to radio frequency integrated circuits. However, inductors and transformers in integrated circuits often take up large areas; therefore, it becomes an important issue to reduce the areas of inductors and transformers in integrated circuits without degrading element performances, such as inductance, quality factor (Q), and coupling coefficient (K).

FIG. 1 illustrates a structure of a conventional 8-shaped integrated inductor. An 8-shaped integrated inductor 100 includes a spiral coil 110 and a spiral coil 120. The spiral coil 110 (120) includes a metal segment 112 (122) and a metal segment 114 (124). The metal segment 112 (122) and the metal segment 114 (124) are connected by through structures at through positions. The through structures can be via structures or a via array. In operation, signals are inputted at one connecting terminal 111 (or 121) of the 8-shaped integrated inductor 100 and outputted at the other connecting terminal 121 (or 111). The 8-shaped integrated inductor 100 has an obvious drawback, that the spiral coil 110 or the spiral coil 120 itself has unsatisfactory symmetry, causing poor performances of the quality factor and the inductance of the 8-shaped integrated inductor 100. Moreover, the two connecting terminals 111 and 121 of the 8-shaped integrated inductor 100 are distant from each other, such that the connection with differential elements in an integrated circuit becomes difficult (which becomes even more apparent as the numbers of turns of the spiral coils get greater).

SUMMARY OF THE INVENTION

In view of the issues of the prior art, an object of this invention is to provide a semiconductor element to improve the performance of an integrated inductor and an integrated transformer.

The present invention discloses a semiconductor element comprising: a first spiral coil, a second spiral coil, a connecting section, and a guide segment section. The first spiral coil is formed with a first end and a second end. The second spiral coil and the first spiral coil are located in substantially a same metal layer. The connecting section connects the first spiral coil and the second spiral coil. One end of the guide segment section is connected to the first end and the second end. A region surrounded by the second spiral coil and at least one of the guide segment section and the connecting section partially overlap.

The present invention also discloses a semiconductor element comprising a first coil, a second coil, a connecting section, a third coil, and a fourth coil. The first coil is substantially located at a first plane. The second coil is substantially located at the first plane. The connecting section connects the first coil and the second coil. The third coil is substantially located at a second plane different from the first plane. The fourth coil is substantially located at the second plane. The third coil and the first coil are connected through a through structure. The fourth coil and the second coil are connected through a through structure. The third coil and the fourth coil are not directly connected.

In comparison with the prior art, the semiconductor element disclosed in the present invention is highly symmetric, which is advantageous to improving the performance of the elements.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
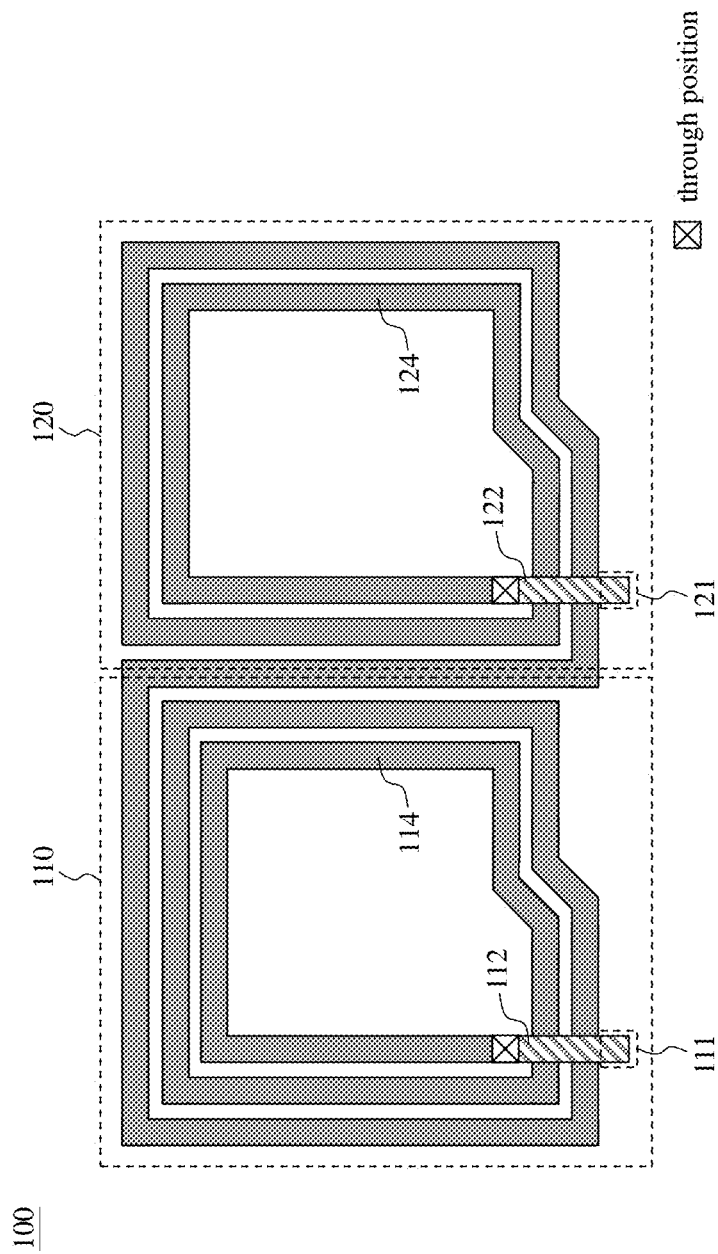
FIG. 1 illustrates a structure of a conventional 8-shaped integrated inductor.
Figure 2A:
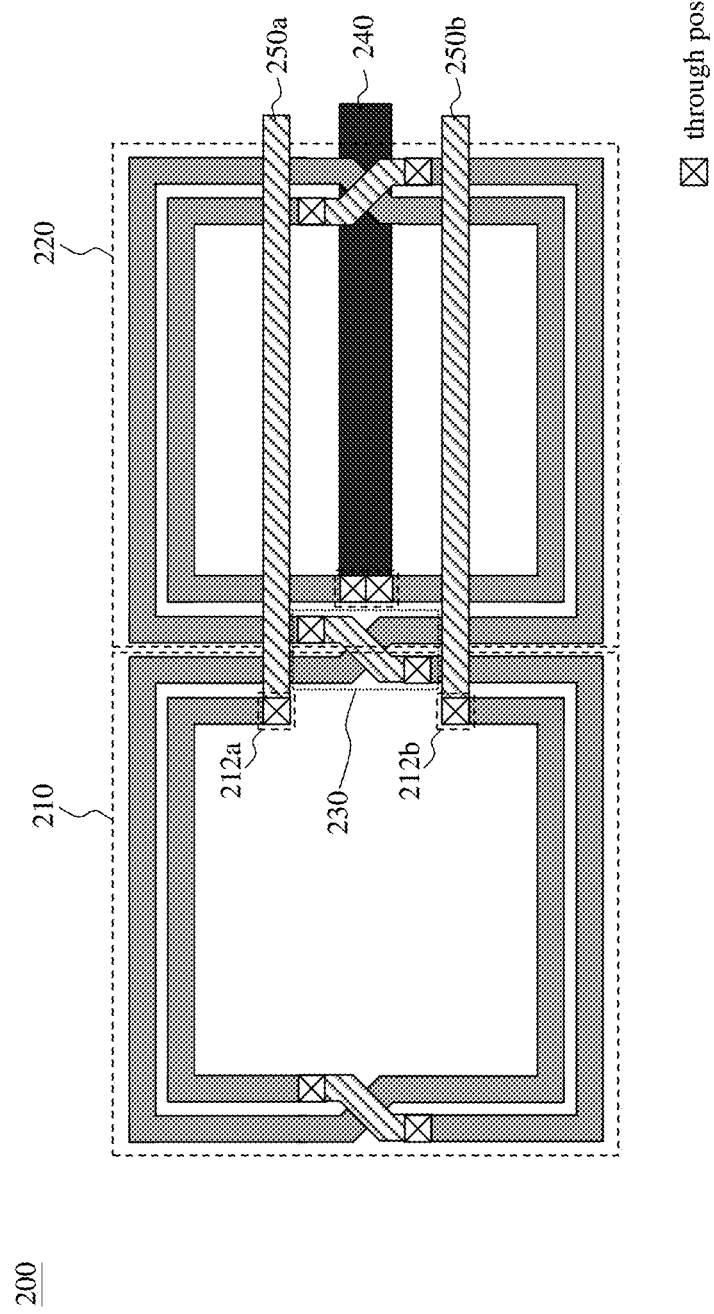
FIG. 2A illustrates a structure of a semiconductor element according to an embodiment of the present invention.

FIG. 2A shows a structure of a semiconductor element according to an embodiment of the present invention. A semiconductor element 200 includes two spiral coils 210 and 220. The spiral coils 210 and 220 are connected by a connecting section 230. The metal segments 250*a* and 250*b* are guide segments of the semiconductor element 200 and thus form a guide segment section of the semiconductor element 200. An end of the metal segment 250*a* is connected to an end 212*a* of the spiral coil 210. An end of the metal segment 250*b* is connected to one other end 212*b* of the spiral coil 210. A center tap 240 of the semiconductor element 200 is connected to the spiral coil 220, and is fabricated in another metal layer (a metal layer different from the metal layer shaded in gray and the metal layer shaded by slanted lines). The center tap 240 can be regarded as another guide segment of the semiconductor element 200. Metal segments in different metal layers are connected by a through structures, which can be a via structure or a via array.

Figure 2B:
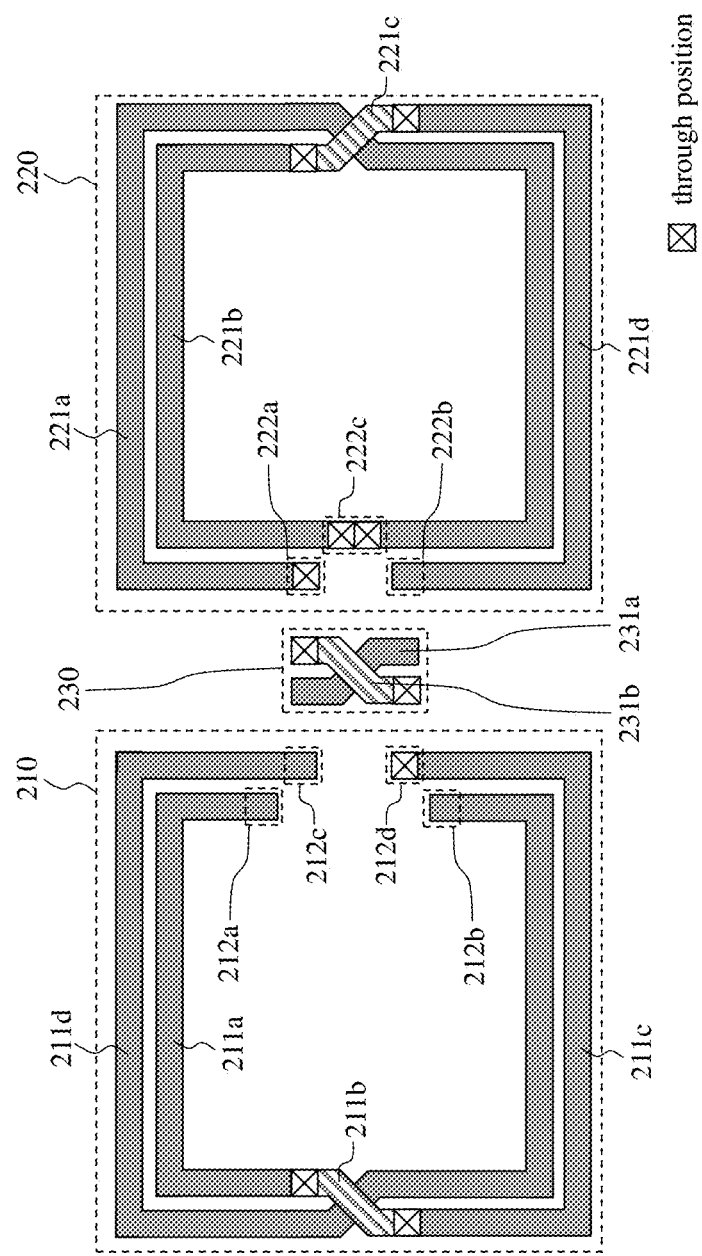
FIG. 2B illustrates shows the spiral coil 210, the spiral coil 220 and the connecting section 230 individually.

FIG. 2B shows the spiral coil 210, the spiral coil 220 and the connecting section 230 individually to illustrate the connections among these three components in a detailed manner. The ends 212a and 212b of the spiral coil 210 are respectively connected to the metal segments 250a and 250b. The spiral coil 210 includes metal segments 211a-211d. The metal segment 211b is fabricated in an upper metal layer (shaded by slanted lines), while the remaining metal segments are fabricated in a lower metal layer (shaded in gray). The spiral coil 210 is a two-turn spiral structure, of which the inner turn is located in a region surrounded by the outer turn. The inner turn of the spiral coil 210 includes the metal segment 211a and a lower part of the metal segment 211d. The outer turn of the spiral coil 210 includes an upper part of the metal segment 211d and the metal segment 211c. Because the metal segment 211b takes up only a small portion of the spiral coil 210, the spiral coil 210 is located in substantially the same metal layer. In other words, the spiral coil 210 is located at substantially the same plane. Similarly, the spiral coil 220 includes metal segments 221a-221d. The metal segment 221c is fabricated in the upper metal layer, while the remaining metal segments are fabricated in the lower metal layer. The spiral coil 220 is a two-turn spiral structure, of which the inner turn is located in a region surrounded by the outer turn. The inner turn of the spiral coil 220 includes the metal segment 221b and a lower part of the metal segment 221a. The outer turn of the spiral coil 220 includes an upper part of the metal segment 221a and the metal segment 221d. Similarly, the spiral coil 220 is located in substantially the same metal layer. In other words, the spiral coil 220 is located at substantially the same plane. The spiral coil 220 is connected to the center tap 240 via the connecting area 222c. The connecting area 222c, located at the inner turn of the spiral coil 220, is an area where the metal segment 221a and the metal segment 221b are connected.

The connecting section 230 includes a connecting segment 231a and a connecting segment 231b. Two ends of the connecting segment 231a are respectively connected to an end 212c of the spiral coil 210 and an end 222b of the spiral coil 220. Two ends of the connecting segment 231b are respectively connected to an end 212d of the spiral coil 210 and an end 222a of the spiral coil 220.

Please refer to FIG. 2A again. Connected to the spiral coil 210, the guide segment section of the semiconductor element 200 partially overlaps a region surrounded by the spiral coil 220 but does not partially overlap a region surrounded by an inner turn of the spiral coil 210. The center tap 240 is connected to an inner turn of the spiral coil 220. In this embodiment, the center tap 240 extends towards the right-hand side of FIG. 2A, partially overlapping a region surrounded by the spiral coil 220. In a different embodiment, the center tap 240 may extend towards the left-hand side of this figure, partially overlapping a region surrounded by the spiral coil 210.

Figure 3:
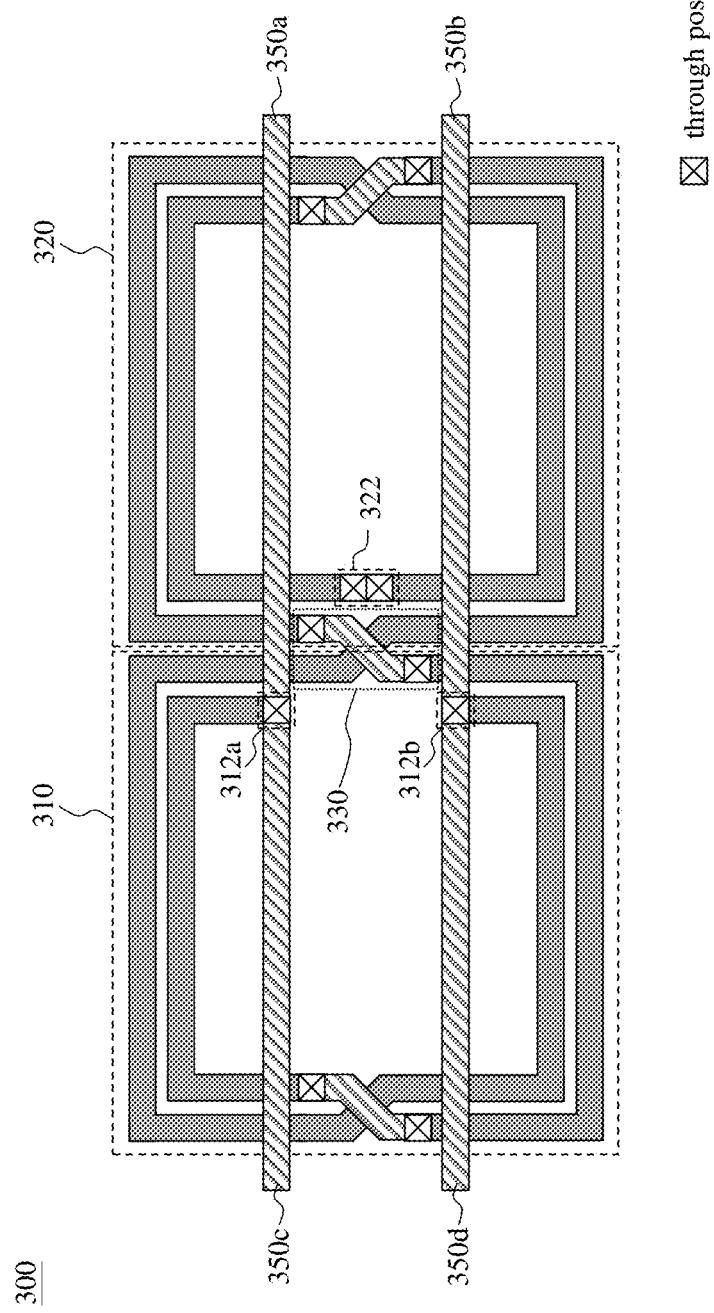
FIG. 3 illustrates a structure of a semiconductor element according to another embodiment of the present invention.

FIG. 3 shows a structure of a semiconductor element according to another embodiment of the present invention. The semiconductor element 300 includes two spiral coils 310 and 320. The spiral coils 310 and 320 are connected by a connecting section 330. Similar to the connecting section 230, the connecting section 330 is formed by two connecting segments, and the details are thus omitted herein for brevity. The metal segments 350a, 350b, 350c and 350d are guide segments of the semiconductor element 300 and thus form a guide segment section of the semiconductor element 300. The metal segments 350a and 350c are connected to the spiral coil 310 via the end 312a. The metal segments 350b and 350d are connected to the spiral coil 310 via the end 312b. The center tap of the semiconductor element 300 (not shown) is connected to the spiral coil 320 through the connecting area 322, and can be regarded as another guide segment of the semiconductor element 300. The center tap of the spiral coil 320 may extend towards the right-hand side of the figure, partially overlapping a region surrounded by the spiral coil 320. In another embodiment, the center tap may extend towards the left-hand side of the figure, partially overlapping a region surrounded by the spiral coil 310.

The guide segment section of the semiconductor element 300 extends towards the left-hand side and the right-hand side of the figure, such that the guide segment section partially overlaps a region surrounded by the spiral coil 310 and a region surrounded by the spiral coil 320. The guide segment section forms an input port or an output port on each side of the semiconductor element 300, which enables the semiconductor element 300 to be connected to its peripheral components in a more flexible manner.

Figure 4:
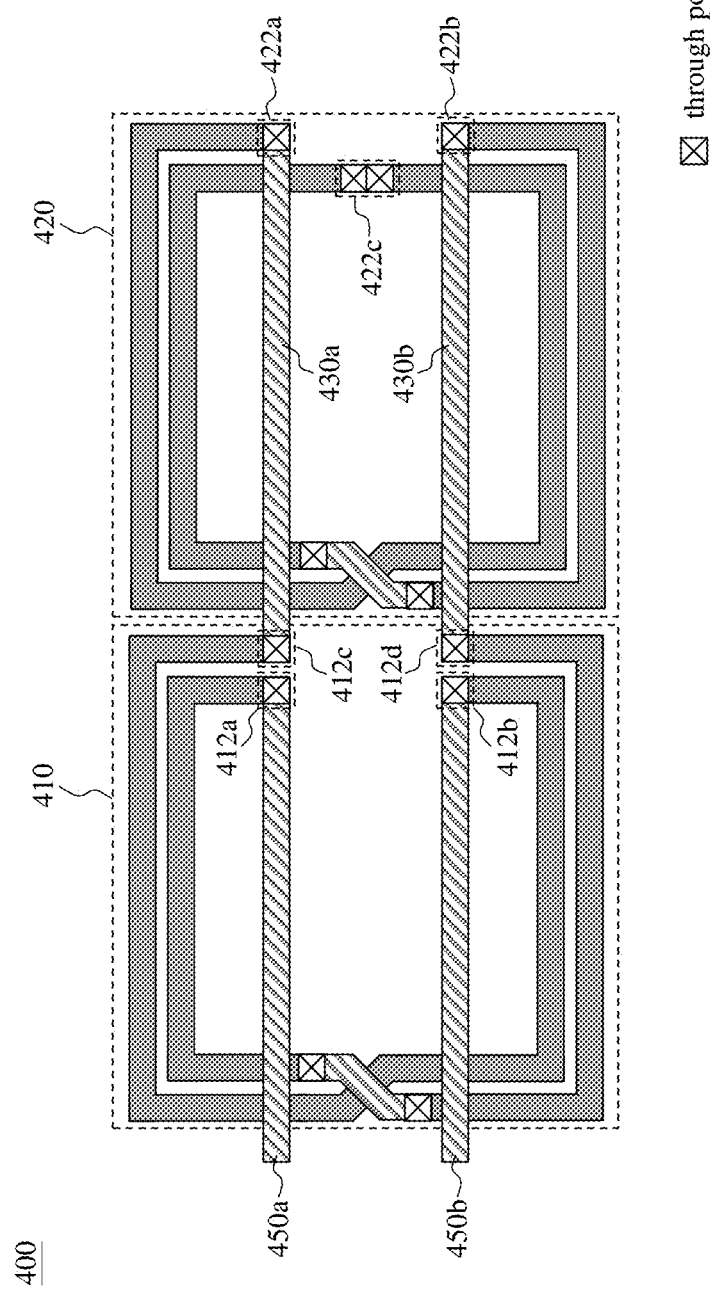
FIG. 4 illustrates a structure of a semiconductor element according to another embodiment of the present invention.

FIG. 4 shows a structure of a semiconductor element according to another embodiment of the present invention. The semiconductor element 400 includes two spiral coils 410 and 420. The connecting segments 430a and 430b form a connecting section of the semiconductor element 400. The spiral coils 410 and 420 are connected by the connecting section. More specifically, the connecting segment 430a connects the end 412c of the spiral coil 410 and the end 422a of the spiral coil 420, and the connecting segment 430b connects the end 412d of the spiral coil 410 and the end 422b of the spiral coil 420. The metal segments 450a and 450b are guide segments of the semiconductor element 400 and thus form a guide segment section of the semiconductor element 400. An end of the metal segment 450a is connected to one end 412a of the spiral coil 410, and an end of the metal segment 450b is connected to the other end 412b of the spiral coil 410. The center tap of the semiconductor element 400 (not shown) is connected to the spiral coil 420 via the connecting area 422c and can be regarded as another guide segment of the semiconductor element 400. The center tap of the semiconductor element 400 may extend towards the right-hand side of the figure without overlapping the regions surrounded by the spiral coils 410 and 420. In another embodiment, the center tap may extend towards the left-hand side of the figure, partially overlapping regions surrounded by the spiral coils 410 and 420.

The connecting section of the semiconductor element 400 connects an outer turn of the spiral coil 410 and an outer turn of the spiral coil 420, and partially overlaps a region surrounded by the spiral coil 420. In the embodiment shown in FIG. 4, a total number of turns of the spiral coil 410 is even, and therefore the guide segment section of the semiconductor element 400 partially overlaps a region surrounded by the spiral coil 410. In another embodiment where a total number of turns of the spiral coil 410 is odd (e.g., three turns, five turn, seven turns, etc.), the guide segment section of the semiconductor element 400 does not overlap a region surrounded by the inner turn of the spiral coil 410.

Figure 5:
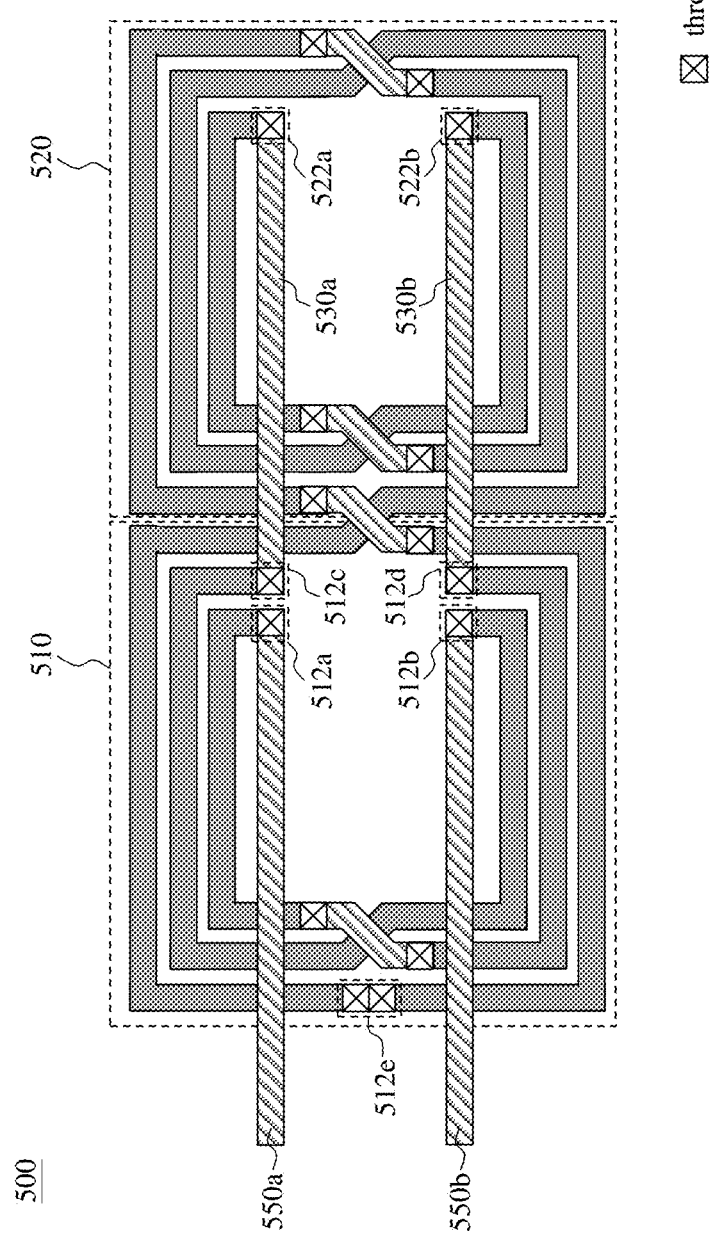
FIG. 5 illustrates a structure of a semiconductor element according to another embodiment of the present invention.

FIG. 5 shows a structure of a semiconductor element according to another embodiment of the present invention. The semiconductor element 500 includes two spiral coils 510 and 520. The connecting segments 530a and 530b form a connecting section of the semiconductor element 500. The spiral coils 510 and 520 are connected by the connecting section. More specifically, the connecting segment 530a connects an end 512c of the spiral coil 510 and an end 522a of the spiral coil 520, and the connecting segment 530b connects an end 512d of the spiral coil 510 and an end 522b of the spiral coil 520. The metal segments 550a and 550b are guide segments of the semiconductor element 500 and thus form a guide segment section of the semiconductor element 500. An end of the metal segment 550a is connected to one end 512a of the spiral coil 510, and an end of the metal segment 550b is connected to one other end 512b of the spiral coil 510. The center tap of the semiconductor element 500 (not shown) is connected to the spiral coil 510 through the connecting area 512e, and can be regarded as another guide segment of the semiconductor element 500. The center tap of the semiconductor element 500 may extend towards the left-hand side of the figure without overlapping regions surrounded by the spiral coils 510 and 520. In another embodiment, the center tap may extend towards the right-hand side of the figure, partially overlapping regions surrounded by the spiral coils 510 and 520.

The spiral coils 510 and 520 are both three-turn spiral structures. The ends 512a and 512b are located at the innermost turn of the spiral coil 510, and the ends 512c and 512d are located at a middle turn of the spiral coil 510. The ends 522a and 522b are located at the innermost turn of the spiral coil 520. The connecting section of the semiconductor element 500 connects the middle turn of the spiral coil 510 and the innermost turn of the spiral coil 520, and partially overlaps a region surrounded by the spiral coil 520. In the embodiment shown in FIG. 5, a total number of turns of the spiral coil 510 is odd, and therefore the guide segment section of the semiconductor element 500 partially overlaps a region surrounded by the spiral coil 510. In another embodiment where a total number of turns of the spiral coil 510 is even (e.g., two turns, four turns, six turns, etc.), the guide segment section of the semiconductor element 500 does not overlap a region surrounded by the inner turn of the spiral coil 510.

Figure 6:
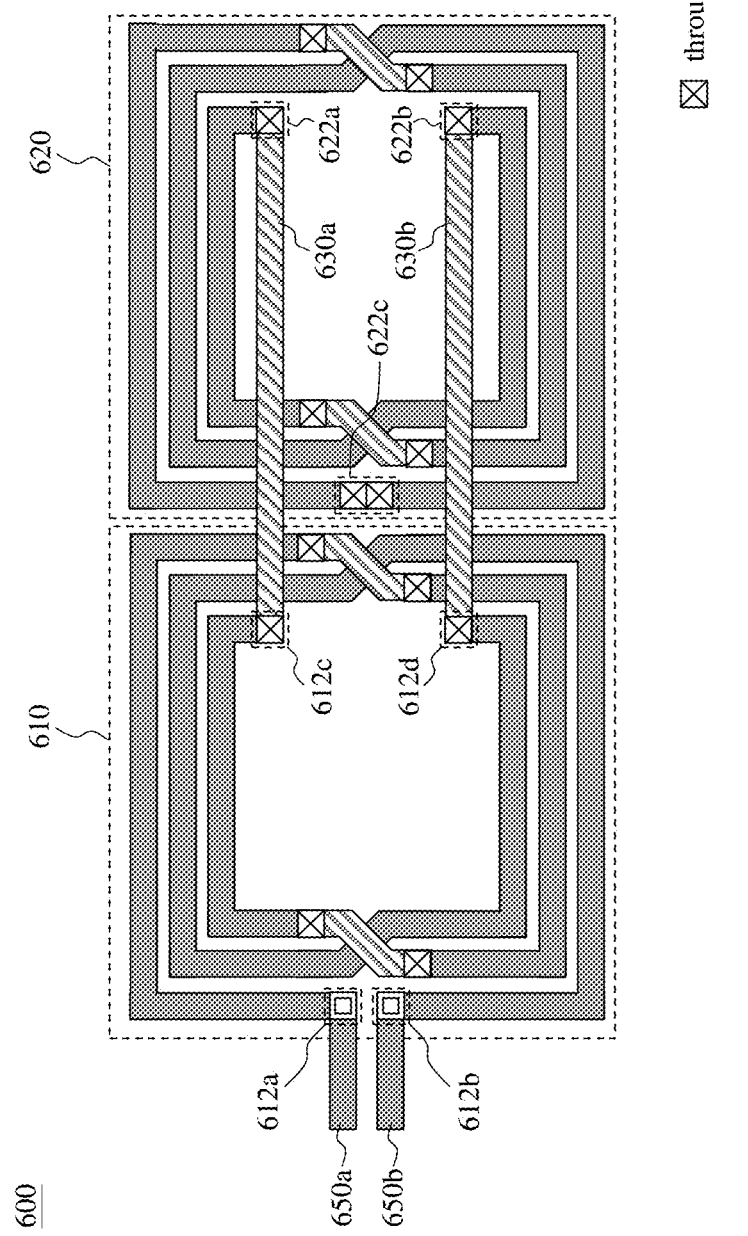
FIG. 6 illustrates a structure of a semiconductor element according to another embodiment of the present invention.

FIG. 6 shows a structure of a semiconductor element according to another embodiment of the present invention. The semiconductor element 600 includes two spiral coils 610 and 620. The connecting segments 630a and 630b form a connecting section of the semiconductor element 600. The spiral coils 610 and 620 are connected by the connecting section. More specifically, the connecting segment 630a connects an end 612c of the spiral coil 610 and an end 622a of the spiral coil 620, and the connecting segment 630b connects an end 612d of the spiral coil 610 and an end 622b of the spiral coil 620. The metal segments 650a and 650b are guide segments of the semiconductor element 600 and thus form a guide segment section of the semiconductor element 600. An end of the metal segment 650a is connected to one end 612a of the spiral coil 610, and an end of metal segment 650b is connected to one other end 612b of the spiral coil 610. The center tap of the semiconductor element 600 (not shown) is connected to the spiral coil 620 through the connecting area 622c, and can be regarded as another guide segment of the semiconductor element 600. The center tap of the semiconductor element 600 may extend towards the right-hand side of the figure, partially overlapping a region surrounded by the spiral coil 620. In another embodiment, the center tap may extend towards the left-hand side of the figure, partially overlapping a region surrounded by the spiral coil 610.

The spiral coils 610 and 620 are both three-turn spiral structures. The ends 612c and 612d are located at the innermost turn of the spiral coil 610, and the ends 622a and 622b are located at the innermost turn of the spiral coil 620. The connecting section of the semiconductor element 600 connects the innermost turn of the spiral coil 610 and the innermost turn of the spiral coil 620, and partially overlaps a region surrounded by the spiral coil 620. The guide segment section and the spiral coil 610 of the semiconductor element 600 are substantially located in the same metal layer.

Figure 7A:
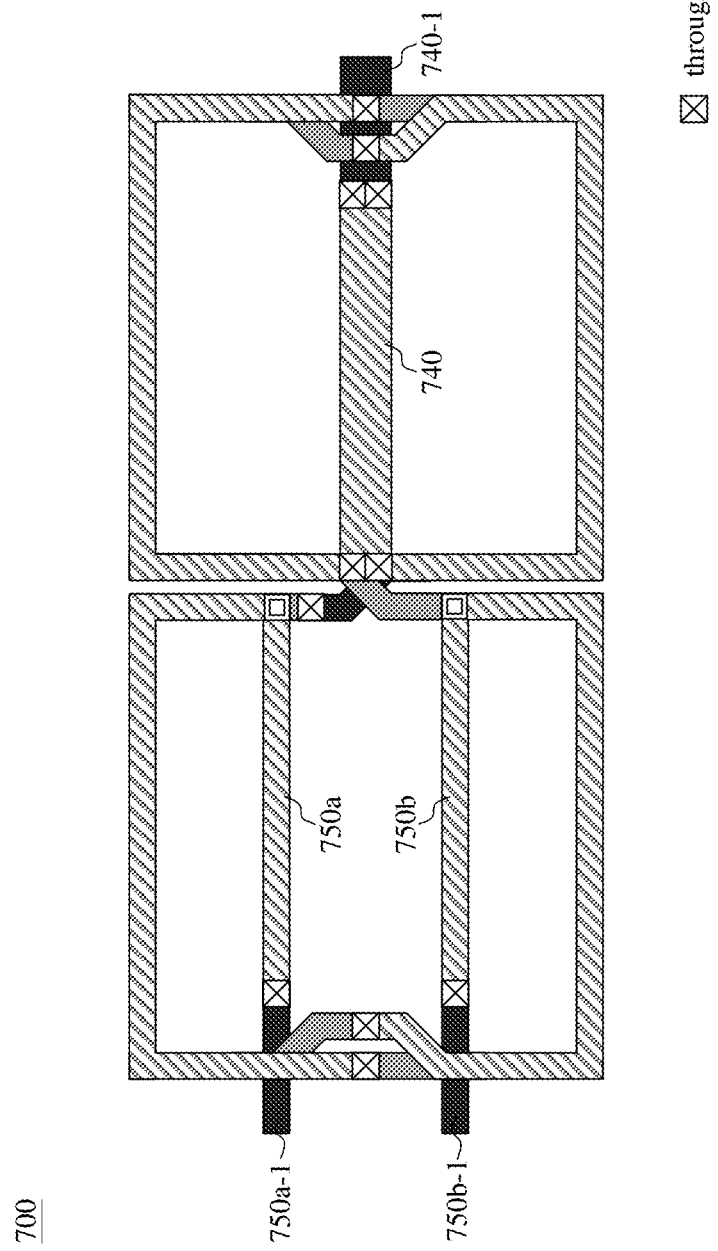
FIG. 7A illustrates a structure of a semiconductor element 700 according to another embodiment of the present invention.
Figure 7B:
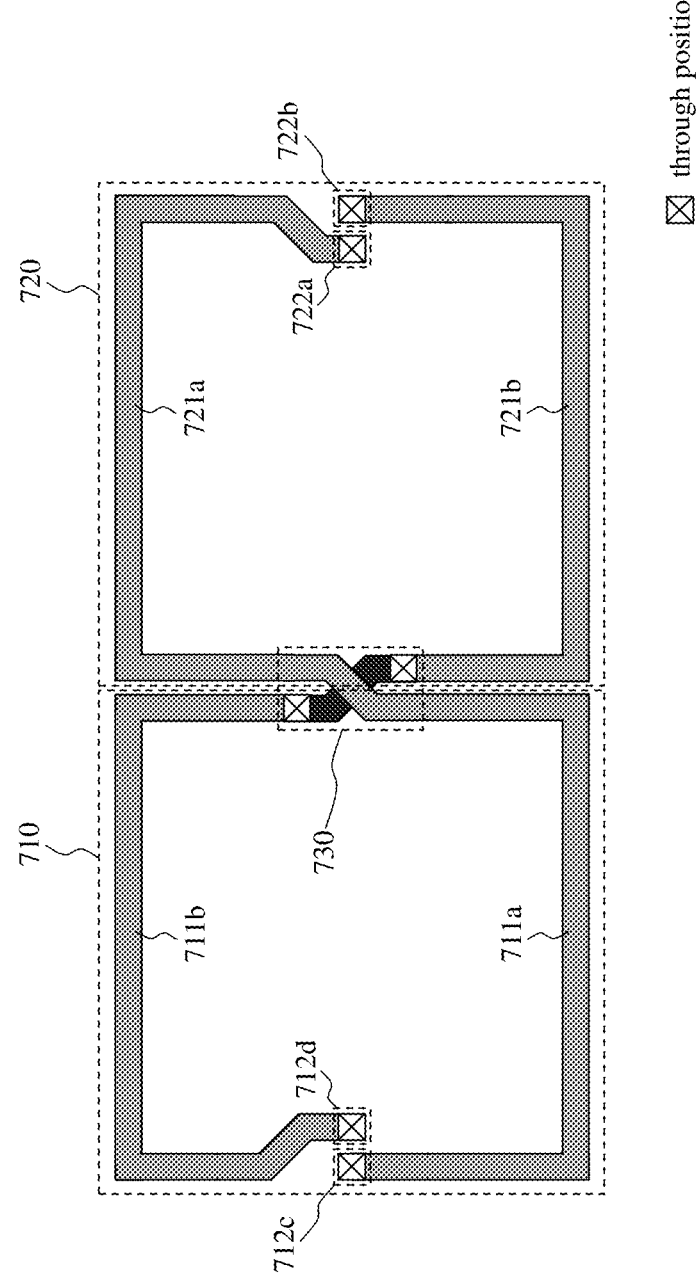
FIG. 7B illustrates the coils of the semiconductor element 700 which are located in the lower metal layer and include a coil 710 and a coil 720.
Figure 7C:
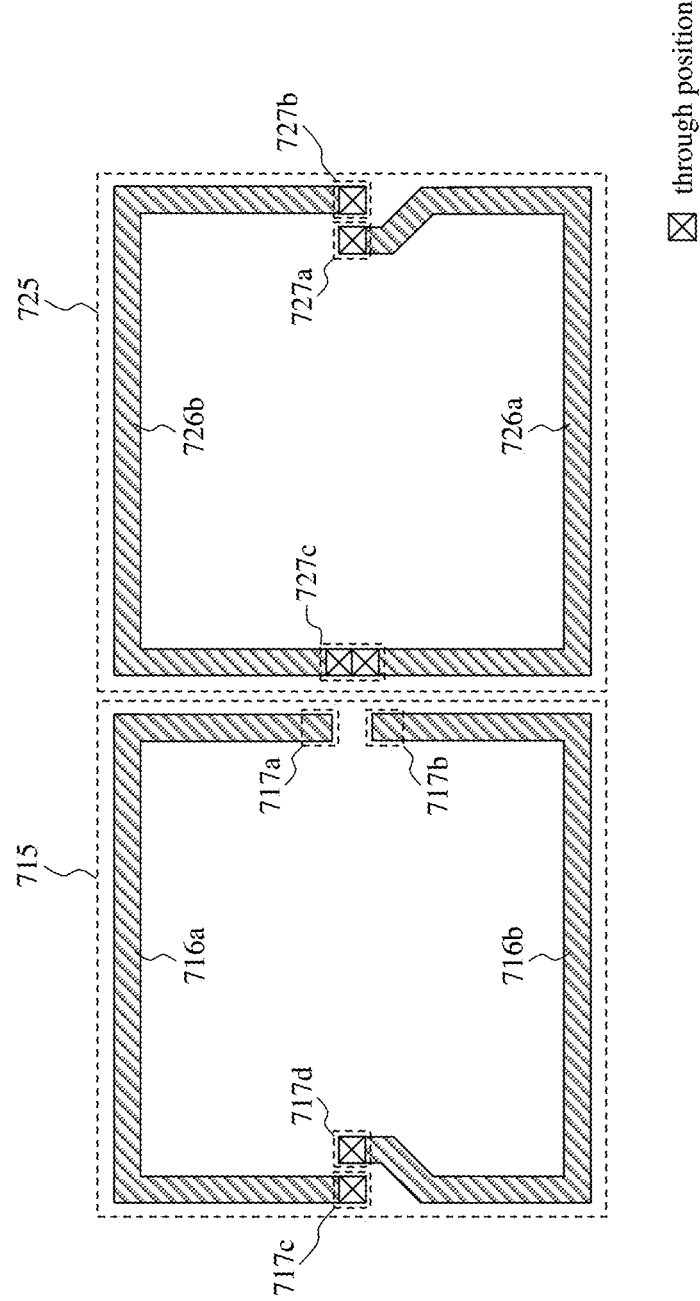
FIG. 7C illustrates coils of the semiconductor element 700 which are located in the upper metal layer and include a coil 715 and a coil 725.

FIG. 7A shows a structure of a semiconductor element 700 according to another embodiment of the present invention. The semiconductor element 700 is substantially made up of multiple coils fabricated in two different metal layers. FIGS. 7B and 7C show the structures of the parts of the semiconductor element 700. FIG. 7B shows the coils of the semiconductor element 700 which are located in the lower metal layer and include a coil 710 and a coil 720. The two coils are located at substantially the same plane of a semiconductor structure and are connected by a connecting section 730. Similar to the connecting section 230, the connecting section 730 is formed by two connecting segments, and the detailed description is thus omitted herein for brevity. The coil 710 includes metal segments 711a and 711b. An end 712c is one of the ends of the metal segment 711a, and the other end of the metal segment 711a is connected to the connecting section 730. An end 712d is one of the ends of the metal segment 711b, and the other end of the metal segment 711b is connected to the connecting section 730. The coil 720 includes metal segments 721a and 721b. An end 722a is one of the ends of the metal segment 721a, and the other end of the metal segment 721a is connected to the connecting section 730. An end 722b is one of the ends of the metal segment 721b, and the other end of the metal segment 721b is connected to the connecting section 730.

FIG. 7C shows coils of the semiconductor element 700 which are located in the upper metal layer and include a coil 715 and a coil 725. The two coils are located in the same plane of a semiconductor structure, which is different from the plane where the coil 710 and the coil 720 are located. The coil 715 and the coil 725 are not directly connected. The coil 715 includes metal segments 716a and 716b. The metal segment 716a is formed with two ends 717a and 717c. The end 717c is connected to the end 712c of the coil 710 by a through structure, and the end 717a and the metal segment 750a are directly connected (as shown in FIG. 7A). The metal segment 716b is formed with two ends 717b and 717d. The end 717d is connected to the end 712d of the coil 710 by a through structure, and the end 717b and the metal segment 750b are directly connected (as shown in 7A). The metal segments 750a and 750b and their respective extended metal segments 750a-1 and 750b-1, which are fabricated in a third metal layer (in black color), form a guide segment section of the semiconductor element 700. The coil 725 includes metal segments 726a and 726b. The metal segment 726a is formed with an end 727a. The end 727a and the end 722a of the coil 720 are connected by a through structure. The metal segment 726b is formed with an end 727b. The end 722b of the coil 720 and the end 727b are connected by a through structure. In one embodiment, the metal segments 726a and 726b may be regarded as a single metal segment, which uses ends 727a and 727b as two ends thereof. In this embodiment, the metal segments 726a and 726b are regarded as two distinct metal segments, and are connected through the connecting area 727c. The connecting area 727c is connected to a center tap of the semiconductor element 700 by a through structure. As shown in FIG. 7A, the center tap of the semiconductor element 700 is formed by the metal segments 740 and 740-1.

As shown in FIG. 7A, the metal segments of the coil 710 and the metal segments of the coil 715 substantially overlap; the metal segments of the coil 720 and the metal segments of the coil 725 substantially overlap. The guide segment section of the semiconductor element 700 partially overlaps the regions surrounded by the coil 710 and the coil 715. The center tap of the semiconductor element 700 partially overlaps the regions surrounded by the coil 720 and the coil 725.

Each of the aforementioned semiconductor elements 200, 300, 400, 500, 600 and 700 can be used as integrated inductors, more specifically, 8-shaped integrated inductors. Taking the semiconductor element 200 as an example, the semiconductor element 200 includes two sensing units; one sensing unit uses the metal segment 250a (equivalent to the end 212a) and the center tap 240 (equivalent to the connecting area 222c) as two ends thereof, and the other uses the metal segment 250b (equivalent to the end 212b) and the center tap 240 (equivalent to the connecting area 222) as two ends thereof. For the sensing unit that includes the metal segment 250a, the electric current flows into the semiconductor element 200 via the metal segment 250a, and passes one half of the spiral coil 210 before entering the spiral coil 220 via the connecting section 230. The electric current continues flowing through one half of the spiral coil 220 before exiting the semiconductor element 200 through the center tap 240. For the sensing unit that includes the metal segment 250b, the electric current flows into the semiconductor element 200 via the metal segment 250b, and passes the other half of the spiral coil 210 before entering the spiral coil 220 via the connecting section 230. The electric current continues flowing through the other half of the spiral coil 220 before exiting the semiconductor element 200 through the center tap 240. Since the two sensing units have metal segments with substantially the same length, and have the same distribution of metal segments in each metal layer, the semiconductor element 200 is of excellent symmetry. In comparison with the prior art, the 8-shaped integrated inductor of the present invention is more symmetric. In fact, the end 212a and the end 212b can be regarded as one of the input port and the output port of the integrated inductor, whereas the connecting area 222c can be regarded as the other. The connecting areas 222c, 322, 422c, 512e, 622c and 727c are connecting points of the center tap of the integrated inductor. In fact, metal segments in those regions are continuous without breaking. The metal segment 250a and the metal segment 250b may be fabricated in a re-distribution layer (RDL).

The aforementioned semiconductor elements 200, 300, 400, 500, 600 and 700 can also be used as integrated transformers. When used as an integrated transformer, taking the semiconductor element 200 as an example, the spiral coil 220 of the semiconductor element 200 can be broken into two ends at the connecting area 222c. The integrated transformer uses the end 212a and the end 212b as one of the input port and the output port, and uses the two ends derived from the connecting area 222c as the other. The impedance matching effect or voltage magnification of the integrated transformer can be adjusted by altering the turns ratio of the spiral coil 210 and the spiral coil 220.

Most metal segments of the semiconductor element of the present invention can be fabricated in an ultra-thick metal (UTM) layer and the RDL of a semiconductor structure. Taking the semiconductor element 200 in FIG. 2B as an example, most metal segments of the spiral coils 210 and 220 can be fabricated in the UTM layer (shaded in gray), and a small portion of the metal segments is fabricated in the RDL (shaded by slanted lines). In a different embodiment, most metal segments of the spiral coils 210 and 220 can be fabricated in the RDL, while a small portion of the metal segments is fabricated in the UTM layer. The center tap of a semiconductor element (e.g., the center tap 240 of FIG. 2A) is fabricated in another metal layer between a substrate and the UTM layer of a semiconductor structure. In a semiconductor structure, there may be a dielectric layer, such as silicon dioxide, between two metal layers.

Please note that the shape, turns ratio, size, and ratio of any element in the disclosed figures are exemplary for understanding, not for limiting the scope of this invention. In addition, although the disclosed embodiments exemplarily demonstrate the applications of the semiconductor elements by applying them to an integrated inductor or an integrated transformer, people having ordinary skill in the art can apply the semiconductor elements to other electronic components.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A semiconductor element, comprising:
    a first spiral coil formed with a first end and a second end and comprising a first outer turn and a first inner turn that is located in a region surrounded by said first outer turn;
    a second spiral coil, wherein said second spiral coil and said first spiral coil are located in substantially a same metal layer, and said second spiral comprises a second outer turn and a second inner turn that is located in a region surrounded by said second outer turn;
    a connecting section, connecting said first spiral coil and said second spiral coil; and
    a guide segment section, with one end connected to said first end and said second end;
    wherein, a region surrounded by said second spiral coil and at least one of said guide segment section and said connecting section partially overlap;
    wherein, said connecting section and a region surrounded by said second spiral coil partially overlap, and said connecting section connects said first inner turn and said second inner turn.

2. The semiconductor element of claim 1, wherein said first spiral coil comprises:
    an outer turn; and
    an inner turn, located in a region surrounded by said outer turn;
    wherein, said guide segment section and a region surrounded by said second spiral coil partially overlap, and said first end and said second end are located at said inner turn.

3. The semiconductor element of claim 2, wherein said guide segment section further partially overlaps a region surrounded by said first spiral coil.

4. The semiconductor element of claim 1, wherein said first spiral coil comprises:

a first outer turn; and
a first inner turn, located in a region surrounded by said first outer turn; and
said second spiral coil comprises:
a second outer turn; and
a second inner turn, located in a region surrounded by said second outer turn;
wherein, said connecting section and a region surrounded by said second spiral coil partially overlap, and said connecting section connects said first outer turn and said second outer turn.

5. The semiconductor element of claim 4, wherein said guide segment section further partially overlaps a region surrounded by said first spiral coil.

6. The semiconductor element of claim 4, wherein said guide segment section and a region surrounded by said first inner turn do not overlap.

7. The semiconductor element of claim 1, wherein said guide segment section further partially overlaps a region surrounded by said first spiral coil.

8. The semiconductor element of claim 1, wherein said guide segment section and a region surrounded by said first inner turn do not overlap.

9. The semiconductor element of claim 1, wherein said first end and said second end are located at said first outer turn.

* * * * *